(12) United States Patent
Tanabe

(10) Patent No.: US 7,106,282 B2
(45) Date of Patent: Sep. 12, 2006

(54) IMAGE DISPLAY

(75) Inventor: Hisao Tanabe, Tokyo (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 141 days.

(21) Appl. No.: 10/476,340

(22) PCT Filed: Mar. 19, 2003

(86) PCT No.: PCT/JP03/03351

§ 371 (c)(1),
(2), (4) Date: Oct. 29, 2003

(87) PCT Pub. No.: WO03/081564

PCT Pub. Date: Oct. 2, 2003

(65) Prior Publication Data

US 2005/0017649 A1    Jan. 27, 2005

(30) Foreign Application Priority Data

Mar. 22, 2002 (JP) ............................. 2002-080540
Mar. 22, 2002 (JP) ............................. 2002-080541
Mar. 22, 2002 (JP) ............................. 2002-080542

(51) Int. Cl.
*G09G 3/10* (2006.01)
(52) U.S. Cl. .................... 345/76; 345/77; 315/169.3
(58) Field of Classification Search ............. 315/169.3; 313/506; 345/76
See application file for complete search history.

(56) References Cited

U.S. PATENT DOCUMENTS

| 5,717,289 A | 2/1998 | Tanaka |
| 5,773,130 A | 6/1998 | So et al. |
| 6,528,951 B1 * | 3/2003 | Yamazaki et al. ....... 315/169.3 |
| 6,545,424 B1 * | 4/2003 | Ozawa .................... 315/169.3 |

FOREIGN PATENT DOCUMENTS

| JP | 59-116779 A | 7/1984 |
| JP | 4-31299 U | 3/1992 |
| JP | 11-111457 A | 4/1999 |
| JP | 2000-21570 A | 1/2000 |
| JP | 2002-260857 A | 9/2002 |

* cited by examiner

*Primary Examiner*—David Vu
(74) *Attorney, Agent, or Firm*—Timothy J. Keefer; Seyfarth Shaw LLP

(57) ABSTRACT

A main object of the present invention is to make it possible to supply current to electric field light emitting elements without decreasing the aperture ratio of pixels. In order to achieve the object, the present invention provides an image displaying device wherein: current driven typed light emitting elements and transistors for current driving are formed on a same substrate; comprising a plurality of display cells having such a structure that the current driven typed light emitting elements and transistors for current driving are connected in between a power supply line and a ground line; the transistors for current driving are selectively driven to conduct display; and a power supply electrode column for supplying currents to each display cell is formed on a power supply common electrode that is formed on a surface of a facing substrate parallel to the substrate.

2 Claims, 3 Drawing Sheets

IMAGE DISPLAY

TECHNICAL FIELD

The present invention relates to an image displaying device using current driven typed light emitting elements such as organic light emitting elements.

BACKGROUND ART

FIG. 4 is a diagram showing an example of an image displaying device using organic light emitting elements. FIG. 4A is a sectional view, and FIG. 4B is a top view.

Insulating layers 2 and 3 are laminated on a glass substrate 1, and an anode 4 made of a transparent conductive film which prescribes each light emitting area, is formed thereon. And further, on the entire surface thereof, an organic light emitting layer 5 and a cathode 6 are formed. Moreover on the glass substrate 1, a transistor for current driving 8 which current is supplied via a power supply line 7, a transistor 9 for ON/OFF control of the transistor for current driving 8, and a vertical electrode 10 and a horizontal electrode 11, for selecting display cells to emit light, are formed. The vertical electrode 10 and the horizontal electrode 11 are insulated by the insulating layer 2. Each transistor is protected by the insulating layer 3, and also a surface on the transistor is smoothed. In addition, the transistor for current driving 8 is connected to the anode 4 via a through hole of the insulating layer 3. Moreover, a facing seal plate 12 is provided so as to cover the entire cathode 6 for hermetically sealing the image displaying device.

In the image displaying device having such a configuration, when the transistor 9, of a display cell selected by the vertical electrode 10 and the horizontal electrode 11, turns on, the transistor for current driving 8 turns on, and a current flows from the power supply line 7 through the anode 4, the organic light emitting layer 5 and the cathode 6, thus the selected cell emits light. This light emitting state is continued until a signal for turning off is applied to the transistor 9. By thus selecting and driving each light emitting cell arranged in a matrix form by transistors, image display is conducted.

The current driven typed light emitting element such as the organic light emitting element emits light by applying current through it, so that, for maintaining the light emitting state, it is necessary to continue applying the current flow. Therefore, for active matrix driving of a current driven typed light emitting element, at least two active elements are needed, one is an element to keep applying the current flow and another is an element to control the former element. Furthermore, to keep applying the current flow, a dedicated current supply line is needed.

As shown in FIG. 4, the current driven typed light emitting element is connected to the transistor for current driving 8, and connected in between the common power supply line 7 and a common installed line (cathode). At least two transistors are required for one current driven typed light emitting element. As for the wiring, four electrodes of a data line for selecting a current driven typed light emitting element, a scanning line (the vertical electrode and the horizontal electrode), the power supply line, and a ground line are needed, resulting in a complicated structure. Especially, as the number of display pixels increases, the power supply line is required to have low resistance because higher current supply capability is required. There is a problem that the aperture ratio of pixels is decreased if the line width is increased in order to lower the resistance.

Furthermore, since the yield of the transistor circuit part and the current driven typed light emitting elements are different, there is also a problem that it is difficult to ensure a high yield and a high quality as the whole.

In some cases, a color conversion method is used in the current driven typed light emitting elements. In the color conversion method, light of a light emitting layer of a specific color is converted to light of another color by using a fluorescent dye. For example, apart of light of the blue color light emitting later is converted to green or red. In this case, the color conversion layer is formed so as to be connected to the light emitting layer. For active matrix driving of organic light emitting elements of such a color conversion method, the following two methods are conceivable.

(1) Thin film transistors are formed on a color conversion layer, and further, an organic electric field light emission layer is formed thereon.

(2) An organic electric field light emission layer is formed on thin film transistors, and further, a color conversion layer is formed thereon.

In the method of (1), the color conversion layer is formed, and thereafter the transistors are formed thereon. Therefore, the color conversion layer is required to have heat resistance of at least the process temperature 400° C. at the time of transistor fabrication, and it is extremely difficult. On the other hand, in the method of (2), the color conversion layer is formed on the light emitting layer. However, since the light emitting layer is extremely vulnerable to moisture, it is extremely difficult to form the color conversion layer directly on the light emitting layer.

As a countermeasure against them, application of, not the bottom emission method in which light is taken out from the glass substrate side as shown in FIG. 4, but the top emission method in which light is taken out from the cathode side is conceivable. This aims to implement active matrix driving of the color conversion method by individually fabricating a substrate having a light emitting layer using a transparent cathode formed thereon and a substrate having a color conversion layer formed thereon, and then putting the substrates together. In addition to a problem in reliability of the transparent cathode, there is a problem that the image quality is degraded because the light emitting layer and the color conversion layer are optically separated so that the occurrence of optical crosstalk is inevitable.

DISCLOSURE OF THE INVENTION

The present invention aims to solve the above mentioned problems. An object of the present invention is to make it possible to supply a current to light emitting elements without decreasing the aperture ratio of pixels and maintain light emitting elements having high quality with a high yield.

Moreover, in the case where the color conversion method is used for current driven typed light emitting elements, an object is to make it possible to conduct active matrix driving of the current driven typed light emitting elements without optical crosstalk and without using a transparent cathode.

Therefore, the present invention provides an image displaying device wherein: current driven typed light emitting elements and transistors for current driving are formed on a same substrate; comprising a plurality of display cells having such a structure that the current driven typed light emitting elements and transistors for current driving are connected in between a power supply line and a ground line; the transistors for current driving are selectively driven to conduct display; and a power supply electrode column for supplying currents to each display cell is formed on a power supply common electrode that is formed on a surface of a facing substrate parallel to the substrate.

Moreover, in the above mentioned invention, it is preferable that the power supply electrode column is connected to a power supply pad provided at a notch that is formed in a part of a cathode formed on the current driven typed light emitting element, and is connected to the transistor for current driving via the pad.

Further, the present invention provides an image displaying device, wherein a substrate having transistors for current driving formed thereon and a substrate having current driven typed light emitting elements formed thereon are faced to each other, and an image is displayed by driving the transistors for current driving and supplying currents individually to each pixel of the current driven typed light emitting elements through a power supply electrode column extending between both substrates.

In the above mentioned invention, it is preferable that an anode, a light emitting layer, and a cathode are formed, in this order, on the substrate having current driven typed light emitting elements formed thereon; also a notch is formed in the light emitting layer and in the cathode per every anode; and the power supply electrode column, extending from the substrate having the transistors for current driving formed thereon, is connected to the notch.

In the present invention, the current driven typed light emitting elements may have a color conversion layer.

In the above mentioned invention, it is preferable that a color conversion layer, an anode, a light emitting layer, and a cathode are formed, in this order, on the substrate having current driven typed light emitting elements formed thereon; also a notch is formed in the light emitting layer and in the cathode per every anode; and the power supply electrode column, extending from the substrate having transistors for current driving formed thereon, is connected to the notch.

BEST MODE FOR CARRYING OUT THE INVENTION

The present invention relates to an image displaying device using current driven typed light emitting elements, such as organic light emitting elements. This image displaying device is characterized in that a power supply electrode column for supplying a current is provided between a substrate having current driven typed light emitting elements formed thereon and another substrate facing across the current driven typed light emitting elements. In the present invention, it is possible to realize an image displaying device in which a current can be supplied to electric field light emitting elements without decreasing the aperture ratio of the pixel part by providing the above mentioned power supply electrode column.

There are three embodiments in the image displaying device of the present invention. In a first embodiment, a power supply common electrode is provided on a substrate facing a substrate having current driven typed light emitting elements formed thereon, and a current is supplied from the power supply common electrode via a power supply electrode column formed in between the substrates. In a second embodiment, transistors for current driving and an organic light emitting layer are respectively formed on different substrates, and those substrates are connected by a power supply electrode column to supply a current. In a third embodiment, transistors for current driving and an organic light emitting layer having a color conversion layer are formed on different substrates, and those substrates are connected by a power supply electrode column to supply a current.

Hereafter, an image displaying device of each embodiment of the present invention will be described.

1. First Embodiment

Figure 1A:
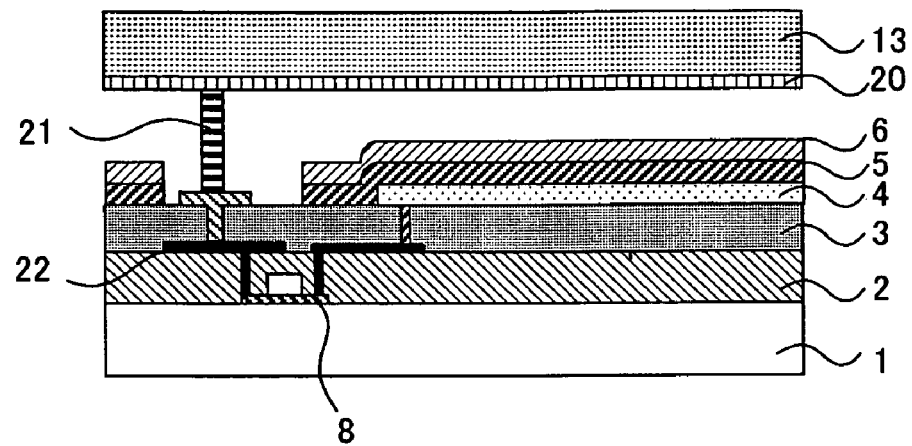
FIGS. 1A–1B is a diagram showing an example of an image displaying device of the present invention.
Figure 1B:
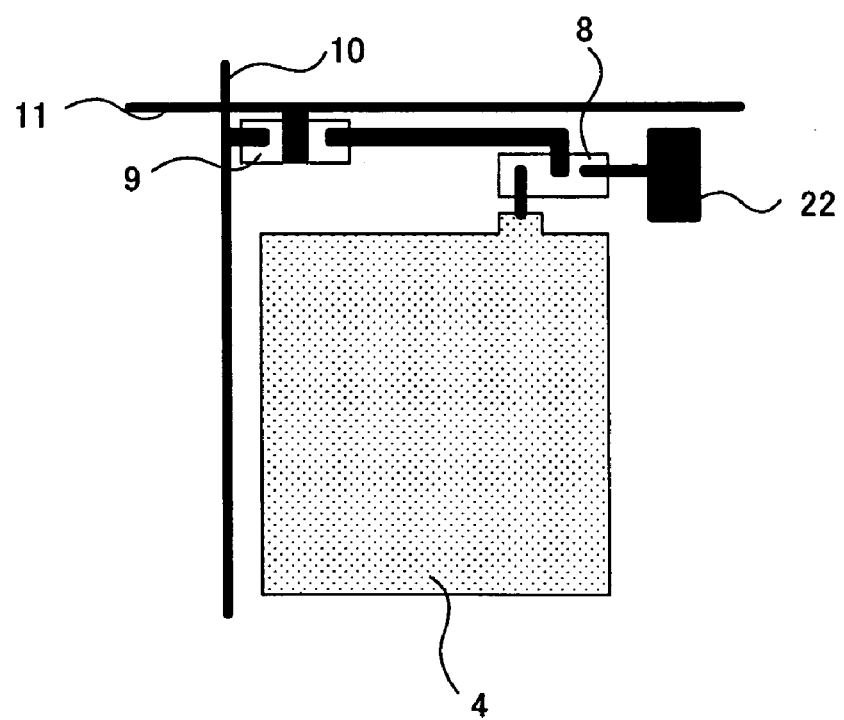
Figure 4A:
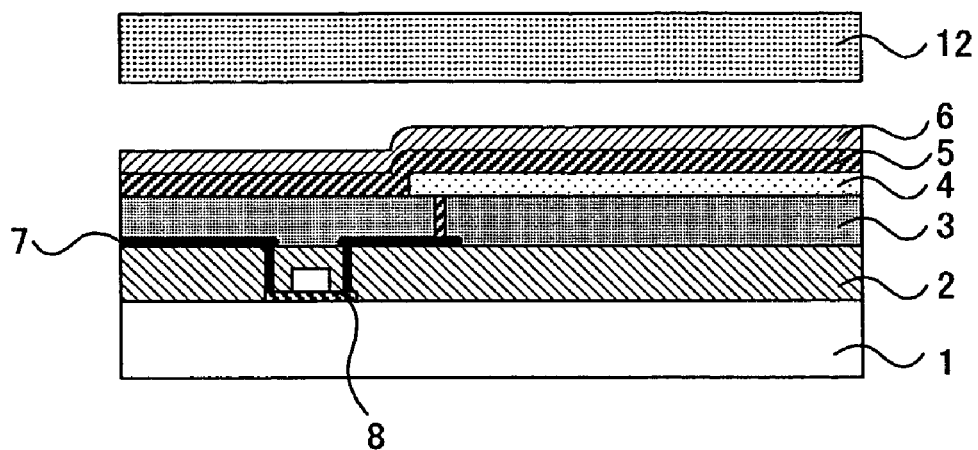
FIGS. 4A–4B is a diagram showing a conventional example of an image displaying device using organic light emitting elements.
Figure 4B:
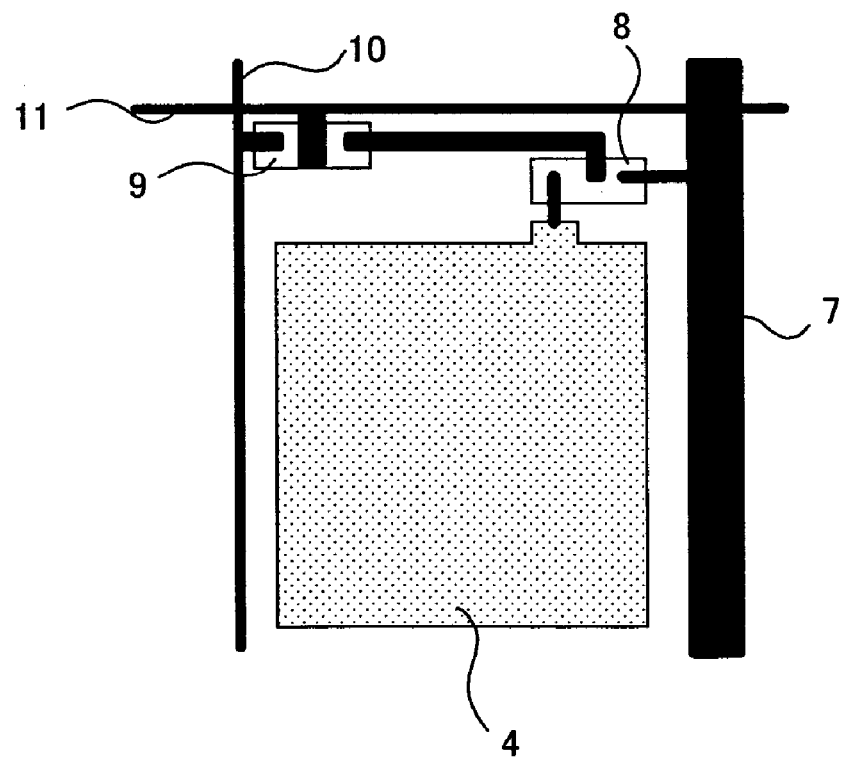

First, a first embodiment in an image displaying device of the present invention will now be described. An image displaying device of the present embodiment will be described with reference to FIG. 1. FIG. 1 is a diagram showing an example of an image displaying device of the present embodiment. FIG. 1A is a sectional view, and FIG. 1B is a top view. The same numerals as those shown in FIG. 4 denote the same contents, so that detailed description thereof will be omitted.

In the present embodiment, insulating layers 2 and 3, an anode 4 formed of a transparent conductive film, an organic light emitting layer 5, and a cathode 6 are formed on a glass substrate 1. In addition, a current is supplied to the anode 4 via a transistor for current driving 8 formed on the glass substrate 1.

In the present embodiment, a power supply common electrode 20 is formed on an entire surface of a facing substrate 13 (corresponding to the facing seal plate 12 in FIG. 4), which is located so as to be faced to the glass substrate 1, facing to the cathode 6. A power supply electrode column 21, for supplying a current to the transistors for current driving 8 of each display cell, is formed on the power supply common electrode 20. The power supply electrode column is formed of metal or conductive resin. The power supply electrode column also has a function as a spacer between substrates. In a part of the cathode 6 and the organic light emitting layer 5 which are formed on the entire surface of the glass substrate 1, a notch is formed per every anode prescribing each light emitting area of display cells. In this part, a power supply pad 22 is formed, and is connected to each power supply electrode column 21.

In such a configuration, a voltage from the power supply common electrode 20 on the facing substrate is always applied to the transistors for current driving 8 through the power supply electrode column 21 and the power supply pad 22. Therefore, if the transistor 9 in the display cell selected by the vertical electrode 10 and the horizontal electrode 11 turns on, then the corresponding transistor for current driving 8 turns on, and a current flows through the anode 4, the organic light emitting layer 5 and the cathode 6 so that the selected cell emits light.

In this way, the power supply lines are not formed on the glass substrate 1 and a current is supplied from the power supply electrode column 21, which extends from the facing substrate perpendicularly, unlike the conventional technique. Therefore, the light emitting area is not restricted by the power supply line, and a high aperture ratio can be ensured. As for the facing substrate 12, it is provided as the seal plate in the conventional technique as well, and the seal plate is also used to form the power supply common electrode. Therefore, while maintaining the conventional structure, the aperture ratio can be increased.

In the conventional technique, when conducting active matrix driving of current driven typed light emitting elements, such as organic light emitting elements, wiring for supplying power to each pixel is needed on the same plane as the light emitting elements, being a factor of decreasing the aperture ratio of the pixels. In the present embodiment, however, the power supply common electrode is formed on the facing seal substrate, and a current is supplied from the power supply common electrode to each pixel through the power supply electrode column. Therefore, the power supply lines on the substrate of the light emitting element side are no longer necessary, and it becomes possible to realize a high aperture ratio.

2. Second Embodiment

Figure 2:
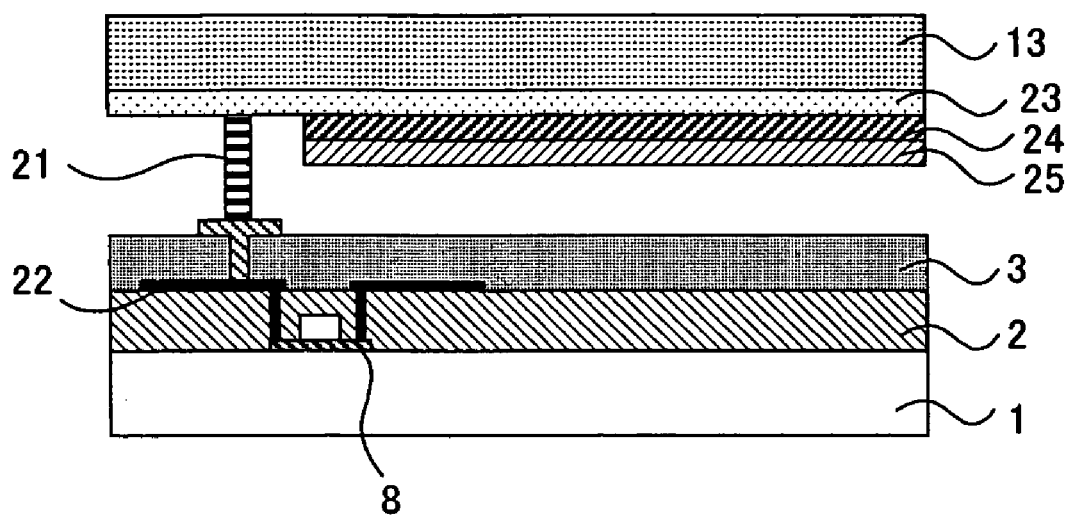
FIG. 2 is a diagram showing another example of an image displaying device of the present invention.

A second embodiment in an image displaying device of the present invention will now be described. The image displaying device of the present embodiment will be described with reference to FIG. 2. In the present embodiment, a substrate having transistors for current driving formed thereon and a substrate having an organic light emitting layer formed thereon are separated. And facing both substrates to each other, a current is supplied per every display cell through a power supply electrode column that extends in between the substrates. A current is supplied without decreasing the aperture ratio, and both substrates which differ in yield can be produces separately.

A transistor for current driving 8, a transistor for ON/OFF control of the transistor for current driving 8, and a vertical electrode and a horizontal electrode for selecting a display cell that should emit light are formed on a glass substrate 1. From a power supply pad 22 which is connected to the transistor for current driving 8, a power supply electrode column 21 penetrates to the surface through an insulating layer 3 and extends to the facing substrate. The vertical electrode and the horizontal electrode are insulated by an insulating layer 2. Each transistor is protected by the insulating layer 3, and the surfaces on the transistors are smoothed. Since electrodes are not formed on the insulating layer 3 in the present embodiment, it is also possible to omit this.

On the other hand, on a glass substrate 13 facing to the glass substrate 1, an anode 23 formed of a transparent electrode is formed per each division, which prescribe light emitting areas. An organic light emitting layer 24 and a cathode 25 are laminated on the anode over the entire surface of the substrate. A notch is formed in a part of the organic light emitting layer 24 and the cathode 25 per every anode, and the power supply electrode column 21 is connected to the anode 23 through this part. The power supply electrode column 21 is formed of metal or conductive resin, and also has a function as a spacer between the both substrates.

In such a configuration, when a transistor, selected by the vertical electrode and the horizontal electrode formed on the glass substrate 1 side, turns on, the pertinent transistor for current driving 8 turns on, and a current flows through the power supply electrode column 21 which is connected to the transistor for current driving 8, the anode 23 which is formed of the corresponding transparent conductive film, the organic light emitting layer 24 and the cathode 25 to make the selected cell emit light. An optical output is obtained from the glass substrate 13 side through the transparent conductive film.

In this way, in the present embodiment, the glass substrate 1 side is used as the circuit substrate for selecting and driving the current driven typed light emitting elements, and the current driven typed light emitting elements are formed on the side of the glass substrate 13, which is facing to the glass substrate 1. Current supply to the current driven typed light emitting elements is conducted by the power supply electrode column 21 which extends vertically from the glass substrate 1 side. Therefore on the substrate of the current driven typed light emitting elements side, the transistors for current driving and wiring for them are no longer necessary so that the light emitting area is not restricted by the power supply line and the like, and a high aperture ratio can be ensured. In addition, quality control of the substrate for the transistor circuit for current driving and the quality control of the substrate for the current driven typed light emitting elements can be done separately.

In the conventional technique, when conducting active matrix driving of current driven typed light emitting elements such as organic light emitting elements, wiring for supplying power to each pixel is needed on the same plane as the current driven typed light emitting elements, resulting to be a factor of decreasing the aperture ratio of the pixels. In the present embodiment, however, the substrate for transistor circuit for current driving and the substrate for the current driven typed light emitting elements are separated, faced to each other, and a current is supplied from the facing substrate for the transistor circuit for current driving to each pixel. Therefore, the transistors for current driving and wiring for them on the substrate for the current driven typed light emitting elements are no longer necessary, and it becomes possible to realize a high aperture ratio.

In addition, the substrate which forms the current driven typed light emitting elements can be completely separated from the substrate which forms the driven elements. Therefore, individual quality control becomes possible, and an extremely high quality can be ensured.

3. Third Embodiment

Figure 3:
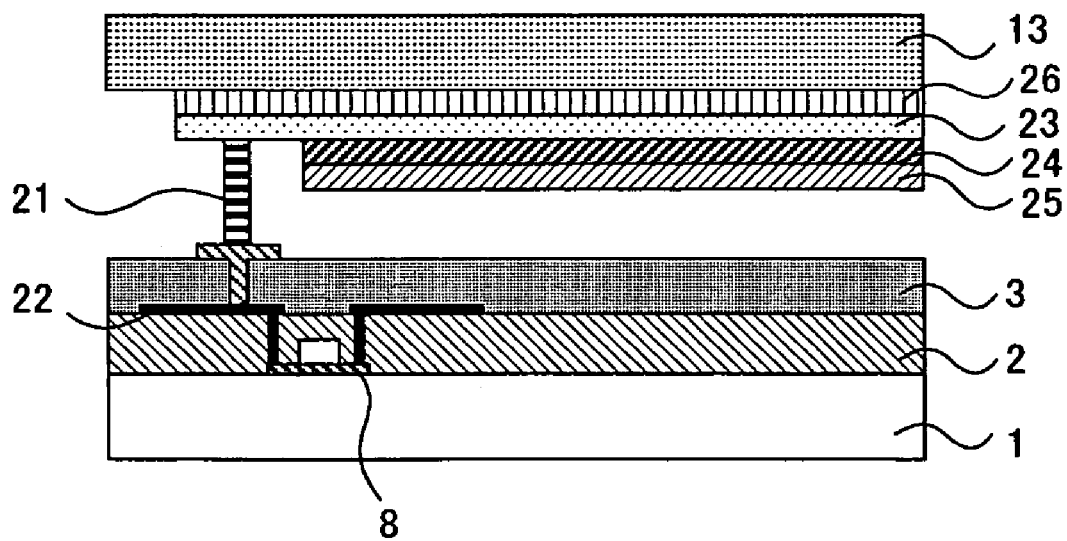
FIG. 3 is a diagram showing another example of an image displaying device of the present invention.

A third embodiment in an image displaying device of the present invention will now be described. The image displaying device of the present embodiment will now be described with reference to FIG. 3. In the present embodiment, a substrate having transistors for current driving formed thereon and a substrate having an organic light emitting layer with a color conversion layer formed thereon are separated, faced to each other, and a current is supplied per every display cell through an electrode column that extends between the both substrates.

A transistor for current driving 8, a transistor for ON/OFF control of the transistor for current driving 8, and a vertical electrode and a horizontal electrode, for selecting a display cell that should emit light, are formed on a glass substrate 1. From a power supply pad 22 which is connected to the transistor for current driving 8, a power supply electrode column 21 penetrates to the surface through an insulating layer 3 and extends to the facing substrate. The vertical electrode and the horizontal electrode are insulated by an insulating layer 2. Each transistor is protected by the insulating layer 3, and the surfaces on the transistors are smoothed. Since electrodes are not formed on the insulating layer 3 in the present embodiment, it is also possible to omit this.

On the other hand, on a glass substrate 13 facing to the glass substrate 1, a color conversion layer 26 is formed by patterning in a photolithography process. On the color conversion layer 26, an anode 23 formed of a transparent electrode is formed per each division, which prescribes each light emitting area. An organic light emitting layer 24 and a cathode 25 are laminated on the anode over the entire surface of the substrate. A notch is formed in a part of the organic light emitting layer 24 and the cathode 25 per every anode, and the power supply electrode column 21 is connected to the anode 23 through this part. The power supply electrode column 21 is formed of metal or conductive resin, and also has a function as a spacer between the both substrates.

In such a configuration, a transistor for current driving 8, selected by the vertical electrode and the horizontal electrode formed on the glass substrate 1 side turns on, and a current flows through the power supply electrode column 21 which is connected to the transistor for current driving, the anode 22 formed of the corresponding transparent conductive film, the organic light emitting layer 23 and the cathode 24 to make the selected cell emit light. A part of light that has passed through the transparent conductive film is converted by the color conversion layer 26. A color optical output is obtained from the side if the glass substrate 13.

In this way, in the present embodiment, the glass substrate 1 side is used as the circuit substrate for selecting and driving the current driven typed light emitting elements, and the current driven typed light emitting elements with color conversion layer are formed on the glass substrate 13, which is faced to the glass substrate 1. Therefore, it is possible to form current driven typed light emitting elements with the color conversion layer with extreme ease and conduct highly definite image display. In addition, quality control of the transistor circuit substrate for current driving and the quality control of the substrate for the current driven typed light emitting elements can be done separately.

In the conventional technique, when conducting active matrix driving of current driven typed light emitting elements such as organic light emitting elements, by using the color conversion method, it is inevitable to use an extremely complicated layer configuration, or use a transparent cathode with the top emission structure, and occurrence of optical crosstalk is inevitable. According to the present embodiment, it is possible to obtain a highly definite image displaying device, conduct individual quality control of the both substrates, and ensure an extremely high quality, by forming the substrate having the transistors for current driving formed thereon and the current driven typed light emitting elements with the color conversion layer formed thereon.

The present invention is not restricted by the above mentioned embodiments. The above mentioned embodiments are nothing but examples. Whatever having substantially the same configuration and bringing about the same operation effects as the technical thought described in claims of the present invention is incorporated in the technical range of the present invention.

The invention claimed is:

1. An image displaying device wherein: current driven typed light emitting elements and transistors for current driving are formed on a same substrate; a plurality of display cells are comprised, with such a structure that the current driven typed light emitting elements and transistors for current driving are connected in between a power supply line and a ground line; the transistors for current driving are selectively driven to conduct display; and a power supply electrode column for supplying currents to each display cell is formed on a power supply common electrode that is formed on a surface of a facing substrate parallel to the substrate.

2. The image displaying device according to claim 1, wherein the power supply electrode column is connected to a power supply pad provided at a notch that is formed in a part of a cathode formed on the current driven typed light emitting element, and is connected to the transistor for current driving via the pad.

* * * * *